US011268895B2

(12) United States Patent
Gan et al.

(10) Patent No.: US 11,268,895 B2
(45) Date of Patent: Mar. 8, 2022

(54) DUSTPROOF TEST DEVICE AND DUSTPROOF TEST METHOD

(71) Applicant: Huawei Technologies Co., Ltd., Shenzhen (CN)

(72) Inventors: Hong Gan, Shenzhen (CN); Pan Zhang, Shenzhen (CN); Xiaozhi Wu, Dongguan (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 76 days.

(21) Appl. No.: 16/692,565

(22) Filed: Nov. 22, 2019

(65) Prior Publication Data

US 2020/0088628 A1   Mar. 19, 2020

Related U.S. Application Data

(63) Continuation of application No. PCT/CN2018/087880, filed on May 22, 2018.

(30) Foreign Application Priority Data

May 25, 2017  (CN) .......................... 201710376320.0

(51) Int. Cl.
*G01N 17/00* (2006.01)
*G01N 15/06* (2006.01)
*G01R 31/00* (2006.01)

(52) U.S. Cl.
CPC ........... *G01N 17/002* (2013.01); *G01N 15/06* (2013.01); *G01R 31/003* (2013.01)

(58) Field of Classification Search
CPC ........ G01N 17/002; G01N 17/00; G01N 3/56; G01N 3/567; G01R 31/003; G01R 31/2862
See application file for complete search history.

(56) References Cited

U.S. PATENT DOCUMENTS

| 2,346,690 | A | * | 4/1944 | Larkins, Jr. | ................... 73/865.6 |
| H1040 | H | * | 4/1992 | Carlon | ........................ 252/408.1 |
| 5,939,617 | A | * | 8/1999 | Lim | ...................... G01N 33/367 |
| | | | | | 73/38 |
| 6,532,797 | B1 | * | 3/2003 | Hackett, Jr. | .......... G01N 15/082 |
| | | | | | 73/38 |

(Continued)

FOREIGN PATENT DOCUMENTS

| CN | 101650354 A | 2/2010 |
| CN | 201532302 U | 7/2010 |

(Continued)

OTHER PUBLICATIONS

Department of Defense Test Method Standard Environmental Engineering Considerations and Laboratory Tests, MIL-STD-810G, Method 510.5—Sand and Dust, Oct. 31, 2008. (Year: 2008).*

(Continued)

*Primary Examiner* — David A. Rogers
(74) *Attorney, Agent, or Firm* — Conley Rose, P.C.

(57) ABSTRACT

A dustproof test device includes a test box and a dust supply apparatus, where the test box includes a sample cabin, where the dust supply apparatus is connected to the test box through a dust tube, and where the dust supply apparatus is configured to transport dust into the sample cabin under the action of compressed air.

19 Claims, 6 Drawing Sheets

(56) References Cited

U.S. PATENT DOCUMENTS

| | | | | |
|---|---|---|---|---|
| 6,688,160 | B2* | 2/2004 | Hackett, Jr. | G01N 15/082 |
| | | | | 73/38 |
| 7,178,384 | B2* | 2/2007 | Bujas | G01N 15/0826 |
| | | | | 73/38 |
| 8,151,630 | B1* | 4/2012 | Gardner | A62B 27/00 |
| | | | | 73/40 |
| 8,393,235 | B2* | 3/2013 | Ciborowski | B60J 5/00 |
| | | | | 73/865.9 |
| 8,448,497 | B2* | 5/2013 | Omori | G01N 15/08 |
| | | | | 73/38 |
| 8,919,195 | B2* | 12/2014 | Yamasaki | B05B 12/02 |
| | | | | 73/299 |
| 9,829,408 | B2* | 11/2017 | An | G01M 3/26 |
| 2007/0131039 | A1 | 6/2007 | Willemin | |
| 2008/0163704 | A1 | 7/2008 | Hsu | |
| 2011/0290043 | A1 | 12/2011 | Lehman et al. | |
| 2014/0338470 | A1 | 11/2014 | Lehman et al. | |
| 2019/0376886 | A1* | 12/2019 | Kammerer | C12Q 1/22 |

FOREIGN PATENT DOCUMENTS

| | | |
|---|---|---|
| CN | 202110065 U | 1/2012 |
| CN | 102435426 A | 5/2012 |
| CN | 203414257 U | 1/2014 |
| CN | 204008411 U | 12/2014 |
| CN | 104596874 A | 5/2015 |
| CN | 105043966 A | 11/2015 |
| SU | 826215 B * | 4/1981 |

OTHER PUBLICATIONS

ESPACENET Machine Translation of SU 826215 B Which Originally Published on Apr. 30, 1981. (Year: 1981).*
Machine Translation and Abstract of Chinese Publication No. CN102435426, May 2, 2012, 8 pages.
Machine Translation and Abstract of Chinese Publication No. CN105043966, Nov. 11, 2015, 12 pages.
Machine Translation and Abstract of Chinese Publication No. CN201532302, Jul. 21, 2010, 8 pages.
Machine Translation and Abstract of Chinese Publication No. CN202110065, Jan. 11, 2012, 4 pages.
Machine Translation and Abstract of Chinese Publication No. CN204008411, Dec. 10, 2014, 8 pages.
Foreign Communication From a Counterpart Application, PCT Application No. PCT/CN2018/087880, English Translation of International Search Report dated Jul. 24, 2018, 2 pages.
Foreign Communication From a Counterpart Application, PCT Application No. PCT/CN2018/087880, English Translation of Written Opinion dated Jul. 24, 2018, 5 pages.

* cited by examiner

DUSTPROOF TEST DEVICE AND DUSTPROOF TEST METHOD

CROSS-REFERENCE TO RELATED APPLICATIONS

This application is a continuation application of International Patent Application No. PCT/CN2018/087880, filed on May 22, 2018, which claims priority to Chinese Patent Application No. 201710376320.0, filed on May 25, 2017. The disclosures of the aforementioned applications are hereby incorporated by reference in their entireties.

TECHNICAL FIELD

The present disclosure relates to the field of electronic device test technologies, and in particular, to a dustproof test device and a dustproof test method.

BACKGROUND

Currently, due to delayering development of networks, more and more communications products (or electronic products) that are originally used in a central equipment room are placed in a non-hermetic open place in which temperature and humidity are uncontrollable, such as a simple equipment room, a corridor, a garage, or a direct ventilation cabinet. Many products on the market fail due to corrosion, a short circuit, or the like caused by comprehensive stress of dust, and temperature and humidity.

A reliability growth test (a test in which real or simulated comprehensive environmental stress is applied to a product to expose a latent shortcoming of the product, and a corrective measure is taken to make reliability of the product meet a predetermined requirement) needs to be performed on an electronic product. Currently, a device is needed to complete such a test.

SUMMARY

Embodiments of the present disclosure provide a dustproof test device that can perform a reliability growth test on an electronic product.

According to a first aspect, an embodiment of the present disclosure provides a dustproof test device, including a test box and a dust supply apparatus, where the test box includes a sample cabin, the dust supply apparatus is connected to the test box through a dust tube, and the dust supply apparatus is configured to transport dust into the sample cabin under the action of compressed air.

In the present disclosure, the dust supply apparatus is driven, using the compressed air, to transport the dust into the sample cabin, to perform a dustproof test on an electronic product, where the dustproof test is a reliability growth test.

In an implementation, a valve, for example, an electric butterfly valve, is disposed on a pipeline (namely, the dust tube) between the dust supply apparatus and the test box, to control dust supply or cut off dust supply.

In an implementation, the dustproof test device further includes a flow control system, where the flow control system is configured to detect a dust concentration in the sample cabin, and control a flow of the compressed air to adjust a flow of the dust transported into the sample cabin.

The dustproof test device provided in this embodiment of the present disclosure controls the flow of the compressed air using the flow control system, to further control the dust concentration in the sample cabin such that the dust concentration in the sample cabin can be controlled and adjusted, to simulate different scenarios to perform a dustproof test on a to-be-tested product.

In an implementation, the dustproof test device further includes an air compressor, where the air compressor is connected to the dust supply apparatus through a compressed air tube, and the air compressor is configured to transport the compressed air into the dust supply apparatus.

In an implementation, the flow control system includes a main control circuit, and the main control circuit is electrically connected to the air compressor, to control the flow of the compressed air. Further, a flowmeter is disposed on the compressed air tube to monitor the flow of the compressed air. The flowmeter may be disposed on a location close to the air compressor on a pipeline of the compressed air tube.

In an implementation, the flow control system further includes a dust concentration sampler, the dust concentration sampler is disposed on the test box and is configured to detect the dust concentration in the sample cabin, the dust concentration sampler is electrically connected to the main control circuit to transmit a detected dust concentration value to the main control circuit, and the main control circuit is configured to compare the detected dust concentration value with the preset setting range of the dust concentration in the sample cabin, and control the flow of the compressed air based on a result of the comparison such that the dust concentration in the sample cabin is maintained within the setting range, where the setting range is a range that is of the dust concentration in the sample cabin and that is preset in the flow control system.

In an implementation, the dust supply apparatus includes a dust flying barrel and a dust feeder, the dust flying barrel is connected to the test box through the dust tube, and the dust feeder is configured to transport dust into the dust flying barrel, to maintain a volume of dust in the dust flying barrel. The dust feeder is disposed such that the dust flying barrel can persistently supply dust. This can prolong a dustproof test time.

In an implementation, a mixer is disposed inside the dust flying barrel, and the mixer is configured to keep dust in the dust flying barrel in a flying state. Further, the mixer may be disposed at the bottom of the dust flying barrel, and the mixer is driven by a motor to rotate. In another implementation, alternatively, the mixer may be disposed on a side wall of the dust flying barrel.

In an implementation, the test box includes a dust distribution apparatus, the dust distribution apparatus is provided with a distribution pipeline and at least two nozzles connected to the distribution pipeline, and the dust tube is connected to the distribution pipeline such that dust falls into the sample cabin through the distribution pipeline and the nozzles. Further, the nozzles are located at a location close to atop of the sample cabin.

In an implementation, each of the nozzles is provided with a cover, and the cover can block or open the nozzle. A quantity of nozzles used in a dustproof test process can be adjusted by blocking or opening the nozzle with the cover, and the quantity of nozzles is adjusted according to different test requirements. The cover may be connected to a frame of the dust distribution apparatus through rotation, and open or close the nozzle through rotation. In another implementation, alternatively, the cover may be disposed on a frame of the dust distribution apparatus through sliding. In the manner in which the connection is implemented through sliding, an opening size of the nozzle may be determined based on a specific location of the cover in a sliding process. The cover may completely block the nozzle, may partially block the nozzle, or may not block the nozzle at all.

In an implementation, the distribution pipeline includes at least two tributaries, and the at least two tributaries are connected in parallel and are disposed in a one-to-one correspondence with the at least two nozzles such that dust in the tributaries falls into the sample cabin through the nozzles by gravity.

Each of the tributaries is of a hollow tubular structure, a plurality of small holes are provided on a tube wall of the tributary, and dust is sprayed from the small holes and falls into the sample cabin through the nozzle.

In an implementation, the distribution pipeline includes a dust collection chamber and at least two branch tubes, the at least two branch tubes are in a one-to-one correspondence with the at least two nozzles, the at least two branch tubes respectively extend from a bottom of the dust collection chamber to the at least two nozzles, and the dust tube stretches into an opening at the top of the dust collection chamber.

In an implementation, the test box further includes a dust accommodating chamber, and the dust accommodating chamber is configured to accommodate dust that falls from the sample cabin. Further, the dust accommodating chamber is located at the bottom of the sample cabin and is connected to the sample cabin. Natural dust fall is simulated in the test box. Therefore, a relatively small volume of dust settles in the sample cabin. Dust in the sample cabin falls into the dust accommodating chamber. The dust accommodating chamber does not collect too much dust, either, and dust in the dust accommodating chamber does not need to be collected for reuse. Therefore, the dust accommodating chamber may be space enclosed at the bottom of the sample cabin.

In an implementation, the dustproof test device further includes a humidity loading apparatus, where the humidity loading apparatus is configured to humidify air in the sample cabin.

In an implementation, the humidity loading apparatus includes a liquid storage barrel and an air source, the liquid storage barrel is connected to the sample cabin through a humidification tube, the air source is configured to transport air into the liquid storage barrel, and the liquid storage barrel is configured to humidify the air and transport the humidified air into the sample cabin through the humidification tube.

In an implementation, an air screen is disposed inside the liquid storage barrel, the air screen is fastened to an inner wall of the liquid storage barrel, a first section is formed between the air screen and a bottom of the liquid storage barrel, a second section is formed between the air screen and a top of the liquid storage barrel, the first section is connected to the second section through meshes of the air screen, the air source is configured to transport air into the first section, and the air screen is configured to decompose, into several small bubbles, the air that is transported into the first section.

In an implementation, the air source is the air compressor, the air compressor is connected to the liquid storage barrel through an air intake tube, one end of the air intake tube is connected to the air compressor, and the other end of the air intake tube stretches into the first section.

In an implementation, dust in the dust supply apparatus includes cement powder and corrosive salt, and the cement powder is a main ingredient. Further, the corrosive salt includes a $Cl^-$ ion, an $SO_4^{2-}$ ion, and an NO ion. A concentration of the $Cl^-$ ion accounts for 1% to 7%, a concentration of the $SO_4^{2-}$ ion accounts for 1% to 5%, and a concentration of the $NO_3^{31}$ ion accounts for less than 1%.

In an implementation, the sample cabin includes an inner wall and an outer wall, space encircled by the inner wall is used to place the to-be-tested product, the outer wall encircles the inner wall, an air duct is formed between the outer wall and the inner wall, the inner wall has a heat conducting function, and the air duct and the inner wall are used to change a temperature in the space encircled by the inner wall.

The dustproof test apparatus further includes a temperature loading apparatus that is disposed outside the test box, where an airflow inlet and an airflow outlet are provided on the outer wall, the temperature loading apparatus is configured to blow an airflow from the airflow inlet into the air duct, and the airflow flows inside the air duct and flows into the temperature loading apparatus through the airflow outlet.

According to another aspect, an embodiment of the present disclosure further provides a dustproof test method, where the dustproof test method is used to perform a reliability growth test on an electronic product, and the dustproof test method includes placing the electronic product in a sample cabin of a test box, and powering on and starting the electronic product for running, and driving a dust supply apparatus using compressed air, to transport dust into the sample cabin such that the dust naturally falls in the sample cabin, to perform a dustproof test on the electronic product.

In an implementation, the dustproof test method further includes starting a flow control system, presetting, in the flow control system, a setting range of a dust concentration in the sample cabin, and detecting the dust concentration in the sample cabin, and controlling a flow of the compressed air to adjust a flow of the dust transported into the sample cabin such that the dust concentration in the sample cabin is maintained within the setting range.

In an implementation, the dustproof test method further includes detecting the dust concentration in the sample cabin, where the detected dust concentration is a dust detection value, comparing the dust detection value with the setting value, and when the dust detection value is less than a minimum value of the setting range, increasing the flow of the compressed air, to increase the dust concentration in the sample cabin, or when the dust detection value is greater than a maximum value of the setting range, decreasing the flow of the compressed air, to reduce the dust concentration in the sample cabin.

In an implementation, the dustproof test method further includes setting a temperature value and a humidity value in the sample cabin, and performing a damp heat test on the electronic product.

In an implementation, the dustproof test method includes after the damp heat test ends, powering off the electronic product, adjusting a temperature in the sample cabin such that the temperature in the sample cabin is a highest temperature that the electronic product can withstand, and then powering on and starting the electronic product for running, and detecting impact of the dust on heat dissipation of the electronic product.

BRIEF DESCRIPTION OF DRAWINGS

To describe the technical solutions in the embodiments of the present disclosure or in the background more clearly, the following briefly describes the accompanying drawings required for describing the embodiments of the present disclosure or the background.

DESCRIPTION OF EMBODIMENTS

The following describes the embodiments of the present disclosure with reference to the accompanying drawings in the embodiments of the present disclosure.

An embodiment of the present disclosure provides a dustproof test device configured to perform a dustproof or dust-resistance test on an electronic device, and test corrosion impact of dust, and temperature and humidity on the electronic device. The dustproof test device provided in this embodiment of the present disclosure is mainly intended for an electronic device that is applied to a non-hermetic open place in which temperature and humidity is controllable, such as a simple equipment room, a corridor, a basement, a garage, or a direct ventilation cabinet. In these environments, dust deposits on a surface of the electronic device. In a humid condition, dust may cause corrosion of the electronic device or a short circuit of a pin of the electronic device. The dustproof test device simulates a scenario with plenty of dust, to verify dust-resistance and corrosion-resistance capabilities of the electronic device used in such an environment. In an embodiment, the electronic device is a communications product, for example, an access switch.

Figure 1:
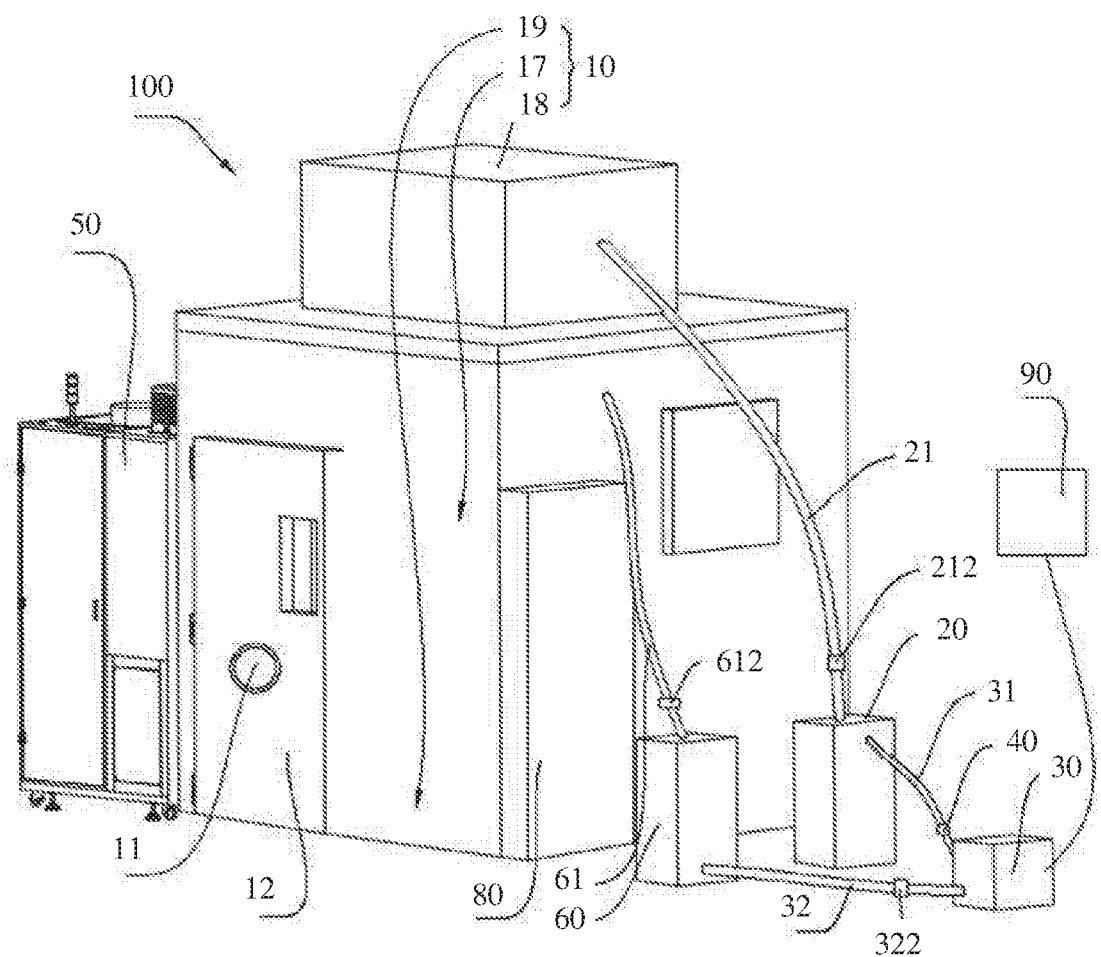
FIG. 1 is a schematic three-dimensional diagram of a dustproof test device according to an embodiment of the present disclosure.

Referring to FIG. 1, a dustproof test device 100 provided in an embodiment of the present disclosure includes a test box 10 and a dust supply apparatus 20. The test box 10 includes a sample cabin 17, and an interior of the sample cabin 17 is used to place a to-be-tested product. The dust supply apparatus 20 is connected to the sample cabin 17 of the test box 10 through a dust tube 21, and the dust supply apparatus 20 is configured to transport dust into the sample cabin 17 under the action of compressed air.

The dustproof test device 100 further includes a flow control system. The flow control system is configured to detect a dust concentration in the sample cabin 17, and control a flow of the compressed air to adjust a flow of the dust transported into the sample cabin 17 such that the dust concentration in the sample cabin 17 is maintained within a setting range, where the setting range is a range that is of the dust concentration in the sample cabin 17 and that is preset in the flow control system.

The dustproof test device 100 further includes an air compressor 30. The air compressor 30 is connected to the dust supply apparatus 20 through a compressed air tube 31, and the air compressor 30 is configured to transport the compressed air into the dust supply apparatus 20. The flow control system includes a main control circuit 90, and the main control circuit 90 is electrically connected to the air compressor 30, to control the flow of the compressed air. Further, the flow control system may be disposed in a host, and the host may be controlled by a remote computer. Alternatively, the flow control system may be disposed beside the test box 10 or integrated to a box body of the test box 10.

A flowmeter 40 is configured to monitor the flow of the compressed air that enters the dust supply apparatus 20.

In this embodiment of the present disclosure, the flow of the compressed air is controlled using the flow control system, to further precisely control a volume of dust that enters the sample cabin 17 of the test box 10 such that dust falls into the sample cabin 17 at an even speed, thereby achieving even and natural dust fall. In addition, the dustproof test device 100 provided in this embodiment of the present disclosure can adjust a concentration of the volume of dust that settles in the test box 10, to simulate different natural environments.

The flow control system further includes a dust concentration sampler 11. The dust concentration sampler 11 is disposed on the test box 10 and is configured to detect the dust concentration in the sample cabin 17. The dust concentration sampler 11 is electrically connected to the main control circuit 90 to transmit a detected dust concentration value to the main control circuit 90. The main control circuit 90 is configured to compare the detected dust concentration value with the preset setting range of the dust concentration in the sample cabin 17, and control the flow of the compressed air based on a result of the comparison.

A manner of controlling the concentration of the volume of dust that settles in the sample cabin 17 is as follows.

The setting range of the dust concentration in the sample cabin 17 is preset in the control system.

The dust concentration sampler 11 is configured to detect the dust concentration in the sample cabin 17, where the detected dust concentration is a dust detection value. Further, the dust concentration sampler 11 is mounted on the box body of the test box 10. The test box 10 includes an openable and closeable box door 12, and the to-be-tested product is placed into the box body through the box door 12. Alternatively, the dust concentration sampler 11 may be disposed on the box door 12. The dust concentration sampler 11 is electrically connected to the main control circuit 90 of the control system, to transmit a detected result (namely, the dust detection value) to the main control circuit 90.

In an embodiment, when the dust detection value is less than a minimum value of the setting range, the flow of the compressed air generated by the air compressor 30 is increased, to increase the flow of the dust supplied to the sample cabin 17, thereby improving the dust concentration in the sample cabin 17. After the dust concentration in the sample cabin 17 reaches or exceeds the minimum value of the setting range, the control system records a flow value (namely, a flow value of the compressed air) corresponding to the flowmeter 40, and then maintains stable output of the air compressor 30.

When the dust detection value is greater than a maximum value of the setting range, the flow of the compressed air generated by the air compressor 30 is reduced, to decrease the flow of the dust supplied to the sample cabin 17, thereby reducing the dust concentration in the sample cabin 17. After the dust concentration in the sample cabin 17 reaches or is less than the maximum value of the setting range, the control system records a flow value (namely, a flow value of the compressed air) corresponding to the flowmeter 40, and then maintains stable output of the air compressor 30.

A manner for controlling the concentration of the volume of dust that settles in the sample cabin 17 is not limited to the manner in the foregoing embodiment. A control procedure may be changed according to a specific requirement, and may be open-loop control or may be closed-loop control. In an implementation of the dust concentration sampler 11, the dust concentration (namely, the dust detection value) in the sample cabin 17 is detected through sampling that is based on the principle of optics, and the volume of dust that enters the test chamber 10 is automatically controlled based on the concentration setting range that is set in the control system.

In this embodiment of the present disclosure, dust is generated by the dust supply apparatus 20 that is independent of the test box 10, and the dust is driven by the air compressor 30 and the dust is transported into the sample cabin 17 of the test box 10. To ensure that the dust evenly settles in the sample cabin 17, no airflow flows in the sample cabin 17.

Figure 2:
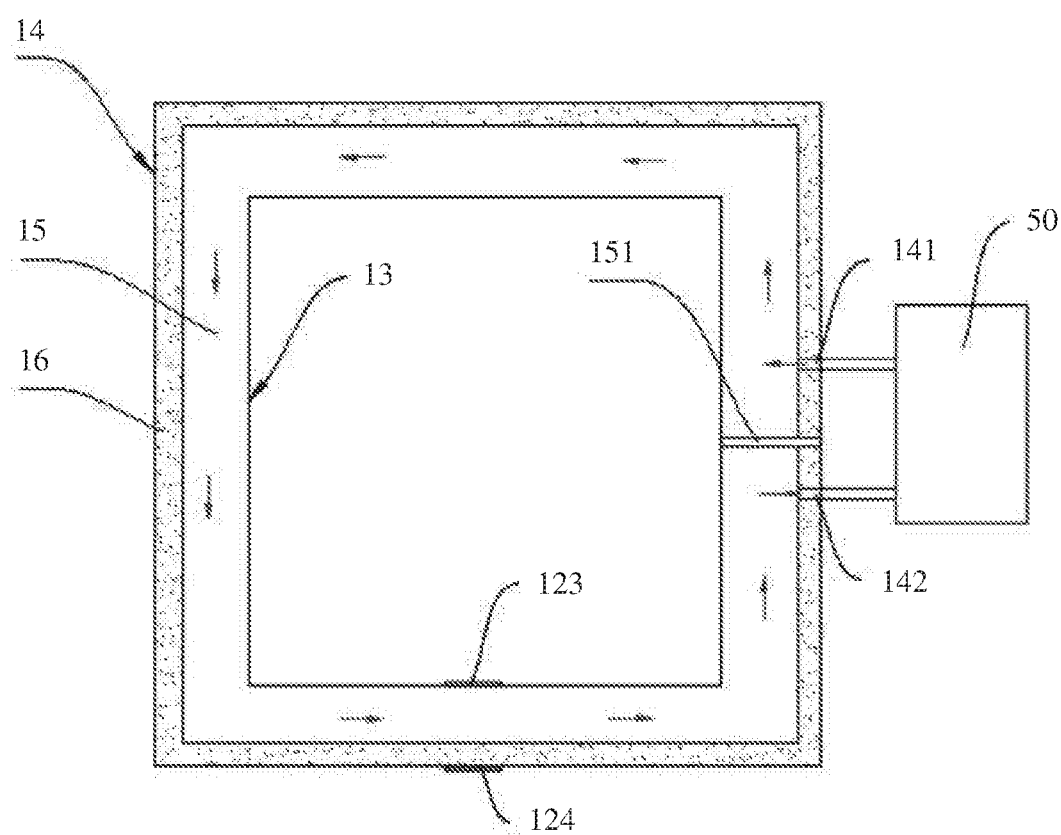
FIG. 2 is a schematic diagram of an internal structure of a sample cabin of a test box in a dustproof test device according to an embodiment of the present disclosure.

Further, referring to FIG. 2, the sample cabin 17 is of a double-layer box structure, and includes an inner wall 13 and an outer wall 14. Space 131 encircled by the inner wall 13 is used to place the to-be-tested product. The outer wall 14 encircles the inner wall 13, and an air duct 15 is formed between the outer wall 14 and the inner wall 13. Further, the inner wall 13 is made of stainless steel, and a heat insulation layer 16 is disposed on an inner surface of the outer wall 14. The heat insulation layer 16 may be made of polyurethane and glass fiber cotton. The heat insulation layer 16 may be attached to the inner surface of the outer wall 14 using glue.

Further, the box door 12 is of a double-layer door structure, and separately includes an inner-wall door 123 connected to the inner wall 12 and an outer-wall door 124 connected to the outer wall 14. The inner-wall door 123 and the outer-wall door 124 are disposed opposite to each other. When the inner-wall door 123 and the outer-wall door 124 are both closed, a portion of the air duct 15 is formed between the inner-wall door 123 and the outer-wall door 124.

In this embodiment of the present disclosure, a temperature of the inner wall 13 is controlled by blowing cold air and hot air in the air duct 15, and a temperature in the sample cabin 17 is controlled using heat conducting and radiation effects of the inner 13 on air in the sample cabin 17 of the test box 10. In this embodiment of the present disclosure, the temperature in the sample cabin 17 is controlled using the air duct 15 between the inner wall 13 and the outer wall 14 and using the inner wall 13 that has a heat conducting capacity. In this way, there is no need to form an air duct in the sample cabin 17, thereby ensuring that there is no airflow in the sample cabin 17.

In an implementation, referring to FIG. 1, the test box 10 further includes a dust accommodating chamber 19, and the dust accommodating chamber 19 is configured to accommodate dust that falls from the sample cabin 17. Further, the dust accommodating chamber 19 is located at the bottom of the sample cabin 17 and is connected to the sample cabin 17.

Natural dust fall is simulated in the test box 10. Therefore, a relatively small volume of dust settles in the sample cabin 17. Dust in the sample cabin 17 falls into the dust accommodating chamber 19. The dust accommodating chamber 19 does not collect too much dust, either, and dust in the dust accommodating chamber 19 does not need to be collected for reuse. Therefore, the dust accommodating chamber 19 may be space enclosed at the bottom of the sample cabin 17.

In an implementation, a temperature loading apparatus 50 is disposed outside the test box 10. The temperature loading apparatus 50 is a system that supplies cold air and hot air, and is connected to the air duct 15 in the test box 10 through a pipeline, to provide cold air and hot air to the air duct 15 and form airflow circulation. Further, an airflow inlet 141 and an airflow outlet 142 are provided on the outer wall 14 of the box body. The airflow inlet 141 and the airflow outlet 142 are separately connected to the temperature loading apparatus 50 through pipelines. The temperature loading apparatus 50 blows an airflow into the air duct 15 through the airflow inlet 141, and the airflow flows clockwise or counterclockwise in the air duct 15 to the airflow outlet 142, and flows into the temperature loading apparatus 50 through the airflow outlet 142. The airflow inlet 141 and the airflow outlet 142 are close to each other, and a separation board 151 is disposed in the air duct 15 between the airflow inlet 141 and the airflow outlet 142. The separation board 151 is disposed to ensure that the airflow can flow in only one direction after entering the air duct 15, thereby form the airflow circulation in the air duct 15.

In an implementation, the temperature loading apparatus 50 generates three-dimensional cold air and hot air circulation using a refrigeration compressor, an electric heater, and a blower.

In this embodiment of the present disclosure, a new-formula dust for test is designed based on ingredients of dust in an actual natural environment. A formula that is for the dust for test and in which cement powder is mixed with soluble salt is used, to test a corrosive effect of the dust. Further, the cement powder is used as a main ingredient of the dust for test, and main ingredients of the cement powder include tricalcium silicate ($3CaO \cdot SiO_2$), dicalcium silicate ($2CaO \cdot SiO_2$), and tricalcium aluminate ($3CaO \cdot Al_2O_3$). A mass percentage of the cement powder is approximately 80%, and a remaining ingredient is corrosive salt. The corrosive salt includes a $Cl-$ ion, an $SO_4^{2-}$ ion, and an $NO_3^-$ ion. According to an anion molar concentration ratio, a concentration of the $Cl^-$ ion accounts for 1% to 7%, a concentration of the $SO_4^{2-}$ ion accounts for 1% to 5%, and a concentration of the $NO_3$ ion accounts for less than 1%.

In an implementation, the dust formula is as follows, a mass percentage of the cement powder is 82.5%, and ingredients of the corrosive salt include NaCl (with a mass percentage of 3.845%), $NaNO_3$ (with a mass percentage of 0.161%), $Na_2SO_4$ (with a mass percentage of 2.080%), $NH_4Cl$ (with a mass percentage of 3.516%), $NH_4NO_3$ (with a mass percentage of 0.151%), $(NH_4)_2SO_4$ (with a mass percentage of 1.934%), $CaCl_2$ (with a mass percentage of 3.648%), $Ca(NO_3)_2$ (with a mass percentage of 0.155%), and $CaSO_4$ (with a mass percentage of 1.992%).

In this embodiment of the present disclosure, the formula in which the cement powder is mixed with the corrosive salt (also referred to as soluble salt) is used based on the ingredients of the dust in the actual natural environment, to replace talcum powder test dust that has no ion ingredient. This resolves a problem that talcum powder has no corrosive effect on a board under the action of humidity. In addition, insoluble dust is mixed in the formula such that a dust accumulation effect is also produced on a circuit unit.

Figure 3:
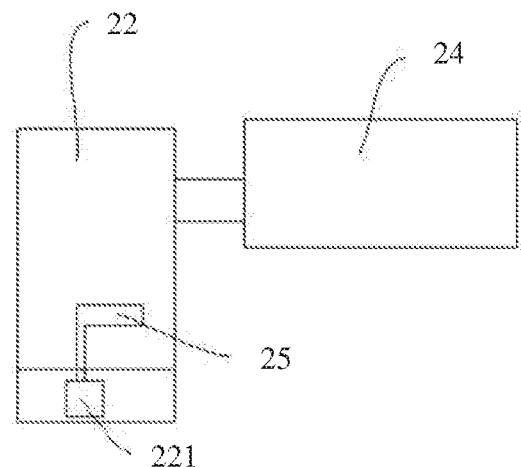
FIG. 3 is a schematic diagram of a dust supply apparatus in a dustproof test device according to an embodiment of the present disclosure.
Figure 4:
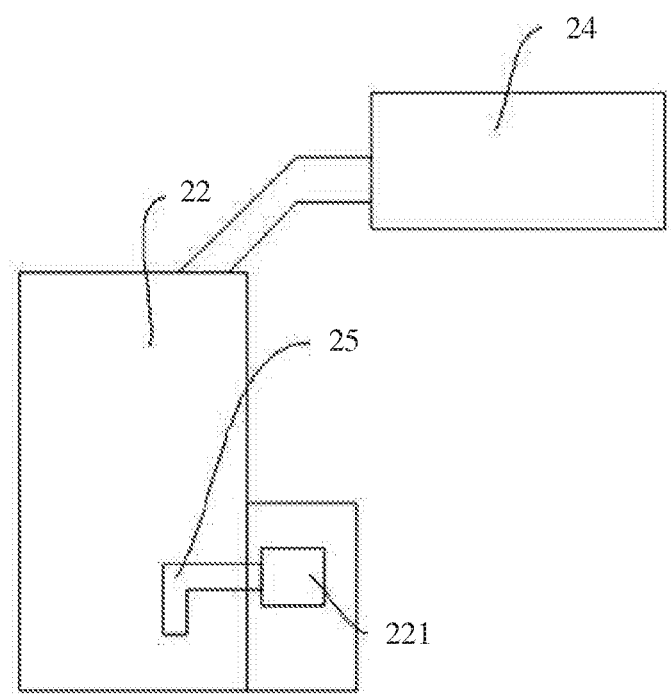
FIG. 4 is a schematic diagram of a dust supply apparatus in a dustproof test device according to an embodiment of the present disclosure.

Referring to FIG. 1, FIG. 3, and FIG. 4, in an implementation, the dust supply apparatus 20 includes a dust flying barrel 22 and a dust feeder 24. The dust flying barrel 22 is connected to the test box 10 through the dust tube 21, and the dust feeder 24 is configured to transport dust into the dust flying barrel 22, to maintain a volume of dust in the dust flying barrel 22, where the transported dust is the test dust in which the cement powder is mixed with the soluble salt. The dust feeder 24 may be independently disposed outside the dust flying barrel 22 and connected to the dust flying barrel 22 through a duct. Alternatively, the dust feeder 24 and the dust flying barrel 22 may be integrated into one apparatus.

A mixer 25 is disposed inside the dust flying barrel 22, the mixer 25 keeps the dust in the dust flying barrel 22 in a flying state, and the dust flying barrel 22 evenly flies portioned test dust. Further, referring to FIG. 3, the mixer 25 may be disposed at the bottom of the dust flying barrel 22, and the mixer 25 is driven by a motor 221 to rotate. The motor 221 is located at the bottom of the dust flying barrel 22, and an output shaft of the motor 221 drives the mixer 25 to rotate, to fly dust. In another implementation, referring to FIG. 4, alternatively, the mixer 25 may be disposed on a side wall of the dust flying barrel 22, a motor 221 is located on a side of the dust flying barrel 22, and an output shaft of the motor 221 drives the mixer 25 to rotate, to fly the dust.

The dust feeder 24 is a screw feeder. An operating principle of the screw feeder is as follows, weight of a passing-by material (namely, dust) is detected using a weigh-bridge, to determine the weight of the material on a rubber belt. A digital speed measurement sensor mounted at a tail part continuously measures a running speed of the feeder, and pulse output of the speed sensor is in direct proportion to the speed of the feeder. A speed signal and a weight signal are sent to a feeder controller together, and are processed by a microprocessor in the controller to generate and display an accumulated volume/a transient flow. The flow is compared with a specified flow, and a control instrument outputs a signal to control a frequency converter to change a driving speed of the feeder such that a flow of the material on the feeder is changed and approximates to and keeps at the specified material feeding flow, thereby meeting a quantitative material feeding requirement.

Figure 5:
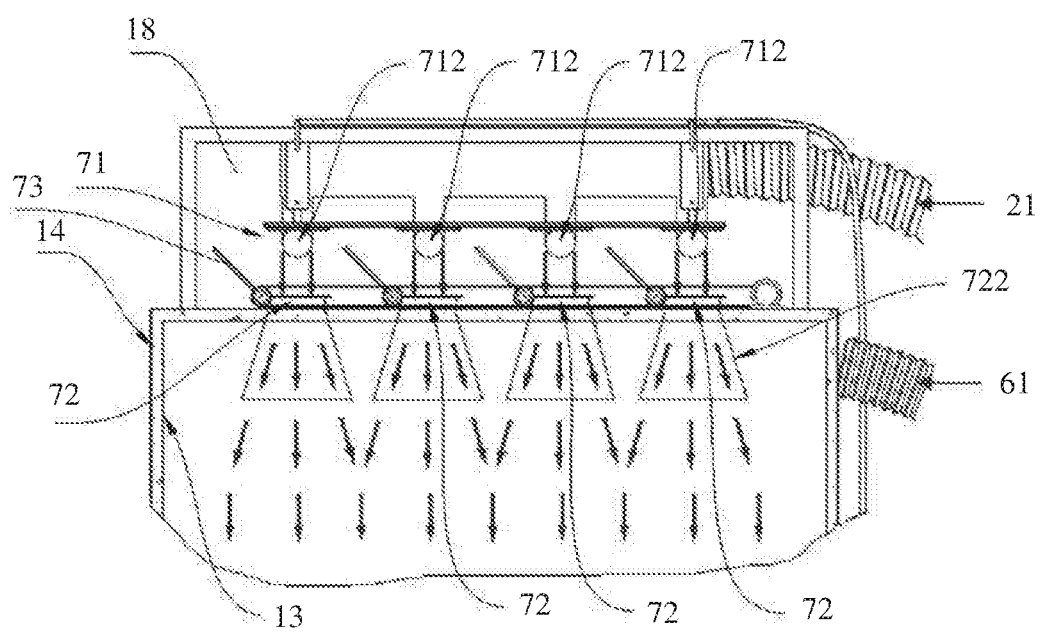
FIG. 5 is a schematic diagram of a dust distribution apparatus in a dustproof test device according to an embodiment of the present disclosure.

Referring to FIG. 5, the test box 10 includes a dust distribution apparatus 18. The dust distribution apparatus 18 is provided with a distribution pipeline 71 and at least two nozzles 72 connected to the distribution pipeline 71, and the dust tube 21 is connected to the distribution pipeline 71 such that dust falls into the test box 10 through the distribution pipeline 71 and the nozzles 72. Further, in an implementation, the dust distribution apparatus 18 is located at the top of the test box 10, the distribution pipeline 71 is located outside the box body of the test box 10, the at least two nozzles 72 are connected to the inner wall 13 of the test box 10, and the distribution pipeline 71 faces the nozzles 72. In another implementation, alternatively, the dust distribution apparatus 18 may be disposed inside the test box 10. In other words, the dust distribution apparatus 18 is integrated into the test box 10. The distribution pipeline 71 is disposed inside the test box 10. Therefore, the distribution pipeline 71 is invisible from outside. The dust distribution apparatus 18 is located at a location close to a top wall inside the test box 10. The to-be-tested product is placed beneath the dust distribution apparatus 18. The dust tube 21 stretches into the test box 10 and is connected to the distribution pipeline 71.

Figure 6:
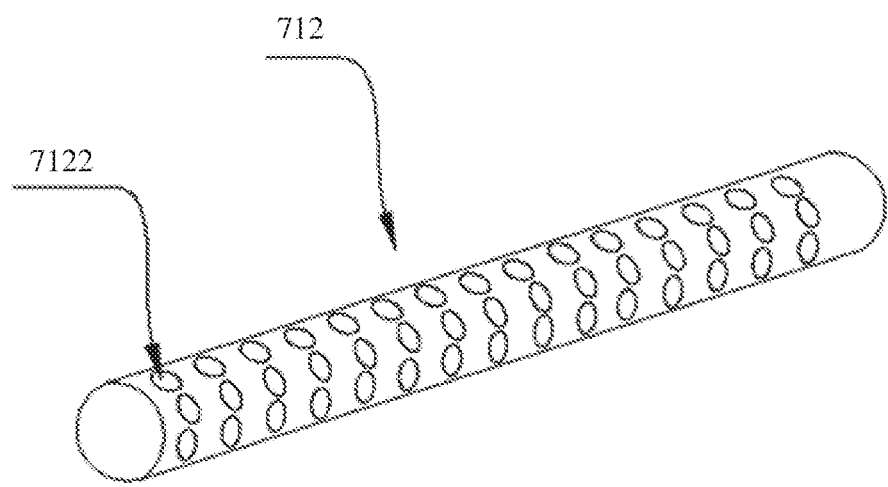
FIG. 6 is a schematic diagram of a tributary of a dust distribution apparatus in a dustproof test device according to an embodiment of the present disclosure.

In an implementation, referring to FIG. 5 and FIG. 6, the distribution pipeline 71 includes a plurality of tributaries 712 that are connected to the dust tube 21. The plurality of tributaries 712 are connected in parallel and are disposed in parallel to each other, and each tributary 712 corresponds to one nozzle 72. Dust in the tributaries 712 falls into the sample cabin 17 through the nozzles 72 by gravity. Further, the tributary 712 may be of a hollow tubular structure and is disposed horizontally above the nozzle 72. A plurality of small holes 7122 are provided on a tube wall of the tributary 712, the small holes 7122 are used to spray dust from a connecting tube, and the dust sprayed from the small holes 7122 falls into the test box 10 through the nozzle 72.

Further, a hollow cylindrical structure 722 that extends from the outer wall 14 of the test box 10 to the inner wall 13 and extends into inner space of the test box 10 is disposed at the nozzle 72. The cylindrical structure 722 is in a trumpet shape, and enlarges and extends in a direction from the outer wall 14 to the inner wall 13. When dust falls from inside of the cylindrical structure 722 into the test box 10, the dust naturally disperses, to form a natural fall state. A line with an arrow in FIG. 5 represents a dust fall direction and path.

In an implementation, as shown in FIG. 5, each of the nozzles 72 is provided with a cover 73, and the cover 73 can block or open the nozzle 72. A quantity of nozzles 72 used in a dustproof test process can be adjusted by blocking or opening the nozzle 72 with the cover 73, and the quantity of nozzles 72 is adjusted according to different test requirements. The cover 73 may be connected to a frame of the dust distribution apparatus 18 through rotation, and open or close the nozzle 72 through rotation. In another implementation, alternatively, the cover 73 may be disposed on a frame of the dust distribution apparatus 18 through sliding. In the manner in which the connection is implemented through sliding, an opening size of the nozzle 72 may be determined based on a specific location of the cover 73 in a sliding process. The cover 73 may completely block the nozzle 72, may partially block the nozzle 72, or may not block the nozzle 72 at all.

Figure 7:
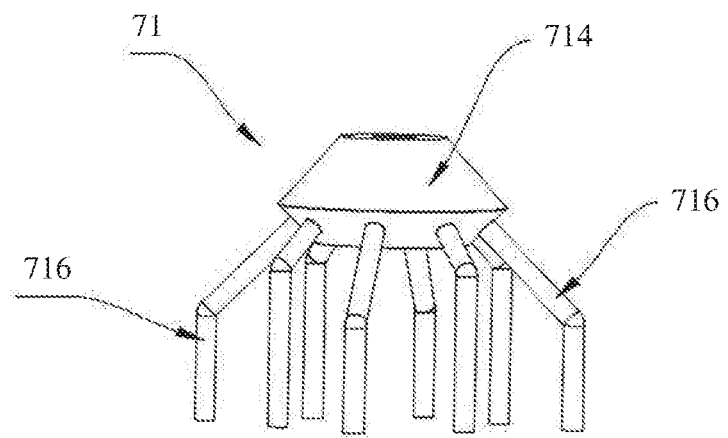
FIG. 7 is a schematic diagram of a distribution pipeline of a dust distribution apparatus in a dustproof test device according to an embodiment of the present disclosure.

In an implementation, referring to FIG. 7, the distribution pipeline 71 includes a dust collection chamber 714 connected to the dust tube 21 and includes a plurality of branch tubes 716. The plurality of branch tubes 716 extend from a bottom of the dust collection chamber 714 to the respective nozzles 72. The plurality of branch tubes 716 and the dust collection chamber 714 form a structure similar to an octopus. The plurality of branch tubes 716 are connected to the bottom of the dust collection chamber 714. An opening is provided at the top of the dust collection chamber 714, and the dust tube 21 extends into the dust collection chamber 714 though the opening.

Referring to FIG. 1, the dustproof test device 100 provided in this embodiment of the present disclosure further includes a humidity loading apparatus configured to humidify air in the sample cabin 17, to simulate natural environments with different humidity. For example, humidity of a coastal city needs to be relatively large, and air humidity in some regions also varies with season. The humidity loading apparatus includes a liquid storage barrel 60 and an air source. The liquid storage barrel 60 is connected to the sample cabin 17 through a humidification tube 61, and the air source is configured to transport air into the liquid storage barrel. In an implementation, the air source is the air compressor 30. The liquid storage barrel 60 is configured to humidify the air and transport the humidified air to the sample cabin 17 through the humidification tube 61. In an implementation, the liquid storage barrel 60 is connected to the air compressor 30 through an air intake tube 32. The liquid storage barrel 60 is connected to the inner space of the test box 10 through the humidification tube 61. The air compressor 30 transports compressed air into the liquid storage barrel 60, and the compressed air enters the sample cabin 17 after passing through water in the liquid storage barrel 60. Further, the liquid storage barrel 60 is filled with water or has a relatively high water level. After passing through the liquid storage barrel 60, the compressed air becomes saturated water vapor with relative temperature of 100% in a water temperature condition corresponding to the compressed air. The saturated water vapor is driven by the air compressor 30 to enter the sample cabin 17 of the test box 10.

In an implementation, one end of the humidification tube 61 is connected to a top of the liquid storage barrel 60, and the other end is connected to a location close to the top of the test box 10.

Figure 8:
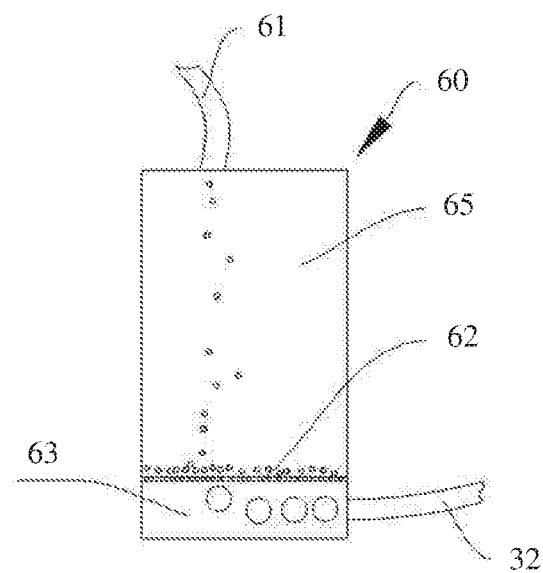
FIG. 8 is a schematic diagram of a water storage barrel of a humidity loading apparatus in a dustproof test device according to an embodiment of the present disclosure.
Figure 9:
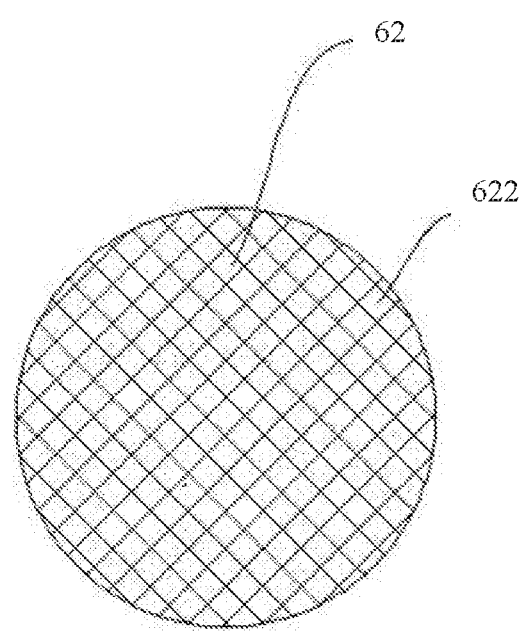
FIG. 9 is a schematic diagram of an air screen of a humidity loading apparatus in a dustproof test device according to an embodiment of the present disclosure.

Referring to FIG. 8 and FIG. 9, an air screen 62 is disposed inside the liquid storage barrel 60. The air screen 62 is fastened to an inner wall of the liquid storage barrel 60. A first section 63 is formed between the air screen 62 and a bottom of the liquid storage barrel 60, and a second section 65 is formed between the air screen 62 and the top of the liquid storage barrel 60. The first section 63 is connected to the second section 65 through meshes 622 of the air screen 62. The air source (namely, the air compressor 30) is configured to transport air into the first section 63, and the air screen 62 is configured to decompose, into several small bubbles, the air that is transported into the first section 63. In other words, a bubble formed after the compressed air enters the first section 63 becomes a plurality of small bubbles with a relatively small volume after passing through the air screen 62.

The humidity loading apparatus can precisely control a water temperature inside the liquid storage barrel 60 such that the water temperature in the liquid storage barrel 60 is less than or equal to a temperature of the inner wall 13 of the test box 10, to avoid a condensation phenomenon on the inner wall 13 of the sample cabin 17.

In an implementation, as shown in FIG. 1, the flowmeter 40 is disposed on the compressed air tube 31 that is connected between the air compressor 30 and the dust supply apparatus 20. Alternatively, a flow adjustment apparatus, for example, a flow adjustment valve, may be disposed on a pipeline of the compressed air tube 31, and the flow of the compressed air that enters the dust supply apparatus 20 is further controlled using the flow adjustment apparatus.

Referring to FIG. 1, a flow adjustment apparatus 322, for example, a flow adjustment valve, may also be disposed on a pipeline between the air compressor 30 and the humidity loading apparatus 60, to control a flow of compressed air that enters the humidity loading apparatus 60. A valve 212, for example, an electric butterfly valve, is disposed on a pipeline between the dust supply apparatus 20 and the test box 10, to control dust supply or cut off dust supply. A valve 612, for example, an electric butterfly valve, is disposed on a pipeline between the humidity loading apparatus 60 and the test box 10, to make moist vapor enter the test box 10 or cut off a channel through which the moist vapor enters the test box 10.

A distribution box 80 is disposed on a side face of the test box 10 in the dustproof test device 100 provided in this embodiment of the present disclosure. The distribution box 80 is configured to supply power to components such as the test box 10, the air compressor 30, the dust supply apparatus 20, and the temperature loading apparatus 50.

In an implementation, a process in which the dustproof test device 100 performs a dustproof test includes the following steps. Step 1. Determine a dust accumulation test condition based on an application environment and a product type of the to-be-tested product, set a dust accumulation concentration and a dust accumulation test time, and start a dust accumulation test. Step 2. Stop the test when an alarm occurs at the to-be-tested product, otherwise, continue the test until the preset dust accumulation test time expires.

In an implementation, a process in which the dustproof test device 100 performs a damp heat test includes the following steps. Step 1. Determine a temperature and humidity of a constant damp heat test based on an application environment and a product type of the to-be-tested product, set a temperature, humidity, and a test time of the constant damp heat test, and start the constant damp heat test. Step 2. Stop the test when an alarm occurs at the to-be-tested product, otherwise, continue the test until the preset constant damp heat test time expires.

The dustproof test device 100 provided in this embodiment of the present disclosure can separately set a test condition based on a dust concentration and high temperature and high humidity duration in an actual application scenario of the to-be-tested product. An actual test condition needs to be set flexibly based on a market research result. The following table is a table of dust test conditions in an embodiment.

TABLE 1

| Dust conditions | | | | |
|---|---|---|---|---|
| Application environment | Applicable product type | Dust accumulation test | Constant damp heat | Circular damp heat |
| Category-A environment | Indoor type | 30 mg/m³, one day | Two days, 40° C., 95% RH | One day, 25° C. to 40° C., 95% RH |
| Category-B environment | Indoor type | 30 mg/m³, three days | Six days, 40° C., 95% RH | Two days, 25° C. to 40° C., 95% RH |
| | Outdoor type | 30 mg/m³, six days | 15 days, 55° C., 95% RH | Two days, 25° C. to 55° C., 95% RH |
| Category-C environment | Indoor type | 30 mg/m³, two days | 20 days, 40° C., 95% RH | Four days, 25° C. to 40° C., 95% RH |
| | Outdoor type | 30 mg/m³, four days | 30 days, 55° C., 95% RH | Four days, 25° C. to 55° C., 95% RH |

Division of the application environments and the product types is described below.

1. A test condition in each scenario approximately corresponds to a degree of corrosion of a device of five years, and another fixed quantity of years of corrosion may be obtained by increasing or decreasing the time based on a corresponding proportion.

2. The indoor type is a device type in which a surface of a device is not directly exposed to a natural environment or is not directly affected by rain, hail, snow, sunlight, or sandy wind when the device is in a working state.

The category-A indoor type is a type of product used in an enclosed indoor scenario in an inland region, for example, a product used in a data center or an equipment room that has enclosed space.

The category-B indoor type is a type of product used in an open indoor scenario in an inland region, for example, a product used in scenarios such as a corridor or a garage in the inland region.

The category-C indoor type is a micro-environment in which a product is located, for example, a product in a direct ventilation cabinet or a sea-view building at a seaside.

3. The outdoor type is a device type in which a surface of a device is directly exposed to a natural environment or is directly affected by rain, hail, snow, sunlight, or sandy wind when the device is in a working state.

The category-B outdoor type is a type of product used in an inland outdoor scenario, for example, an outdoor cabinet or an integrated device that is used in an inland region.

The category-C outdoor type is an outdoor device used in a near-sea region, for example, a near-sea outdoor cabinet or integrated device.

Specific test steps of the dustproof test device 100 provided in this embodiment of the present disclosure are as follows.

(1) Power on a sample (namely, the to-be-tested product), ensure that the sample operates normally, and persistently monitor an operating status of the device in the process.

For a sample that is forcibly air-cooled, during dust flying, a fan speed is automatically adjusted at full load, or is a rotation speed estimated at full load at this temperature. If a specific value cannot be determined, it is recommended that the fan speed is set to 60%-70% of a maximum rotation speed. During a damp heat test, the fan speed is automatically adjusted based on minimum power consumption.

(2) Set a dust accumulation condition according to the parameter requirements of a simulated dust accumulation test that are shown in the foregoing table (the table of dust test conditions), adjust a dust concentration monitor, and start a dust accumulation test.

(3) Persistently monitor a service operating status and a related alarm, and after dust accumulation ends, open the box to check a dust accumulation status inside the device, and photograph and record dust accumulation phenomena on components (such as air inlet meshes, a fan, and a service board) in the device.

(4) Set temperature and humidity values in the test box 10 to perform a constant damp heat test, persistently monitor a service operating status and a related alarm, and record a type and an occurrence time of each alarm.

(5) When the damp heat test ends or there is alarm information indicating that the device is unrecoverable, open the box to inspect a corrosion status of the to-be-tested product, and photograph and record the corrosion status, especially take a close-up shot of a position at which a corrosion phenomenon occurs.

(6) Set a thermal box program based on the foregoing circular damp heat test conditions, start a test, and persistently monitor an operating status of the device in the process.

(7) After the damp heat test ends, power off the to-be-tested product, adjust a temperature in the sample cabin 17 to a highest temperature that the to-be-tested product can withstand, power on and start the electronic product for running, operate a service at full load, and check and record a service operating status, especially high temperature alarm information, to detect impact of dust accumulation on heat dissipation of the to-be-tested product.

(8) After the test ends, visually inspect a corrosion status of the to-be-tested product, photograph and record the corrosion status, especially take a close-up shot of a position (such as a backplane connector, a power module, and a through hole) at which a corrosion phenomenon occurs, and determine a test result of the to-be-tested product according to a test qualification criterion.

In this embodiment of the present disclosure, comprehensive stress of corrosive dust, temperature, humidity, and a power-on condition can be loaded at a same time such that simulation of a corrosion effect on a to-be-tested product (such as a circuit board or another electronic product) in an actual natural environment can be accelerated, thereby greatly improving reliabillity excitation efficiency of an anti-corrosion weakness of the to-be-tested product.

What is claimed is:

1. A dustproof test device, comprising:
   a test box comprising a sample cabin;
   a dust tube;
   a dust supply apparatus coupled to the test box through the dust tube, wherein the dust supply apparatus is configured to transport dust into the sample cabin under force from compressed air; and
   a flow control system coupled to the test box and configured to control a flow of the dust into the sample cabin such that the dust enters the sample cabin at an even rate.

2. The dustproof test device of claim 1, wherein the flow control system is configured to:
   detect a dust concentration in the sample cabin; and
   control a flow of the compressed air to adjust the flow of the dust transported into the sample cabin.

3. The dustproof test device of claim 2, further comprising an air compressor and a compressed air tube, wherein the air compressor is coupled to the dust supply apparatus with the compressed air tube, and wherein the air compressor is configured to transport the compressed air into the dust supply apparatus.

4. The dustproof test device of claim 3, further comprising a flowmeter coupled to the compressed air tube and configured to monitor a flow of the compressed air that enters the dust supply apparatus.

5. The dustproof test device of claim 3, wherein the flow control system comprises a main control circuit electrically coupled to the air compressor and configured to control the flow of the compressed air.

6. The dustproof test device of claim 5, wherein the flow control system further comprises a dust concentration sampler electrically coupled to the main control circuit and configured to:
   detect the dust concentration in the sample cabin; and
   transmit a dust concentration value to the main control circuit based on the dust concentration.

7. The dustproof test device of claim 6, wherein the main control circuit is further configured to:
   compare the dust concentration value with a preset setting range of the dust concentration to obtain a result; and
   control the flow of the compressed air to maintain the dust concentration within the preset setting range based on the result, wherein the preset setting range is the dust concentration that is preset in the flow control system.

8. The dustproof test device of claim 7, wherein the main control circuit is configured to increase the flow of the compressed air when the result is less than a minimum value of the preset setting range.

9. The dustproof test device of claim 7, wherein the main control circuit is configured to decrease the flow of the compressed air when the result is greater than a maximum value of the preset setting range.

10. A dustproof test method, comprising:
   providing a dustproof test device, comprising:
      a test box comprising a sample cabin;
      a dust tube;
      a dust supply apparatus coupled to the test box through the dust tube; and
      a flow control system coupled to the test box;
   transporting dust into the sample cabin under force from compressed air using the dust supply apparatus; and
   controlling a flow of the dust into the sample cabin using the flow control system such that the dust enters the sample cabin at an even rate.

11. The dustproof test method of claim 10, further comprising:
   detecting a dust concentration in the sample cabin using the flow control system; and
   controlling, based on detecting the dust concentration in the sample cabin, a flow of the compressed air using the flow control system.

12. The dustproof test method of claim 10, further comprising adjusting, based on controlling the flow of the compressed air, the flow of the dust transported into the sample cabin using the flow control system.

13. The dustproof test method of claim 10, wherein the dustproof test device further comprises an air compressor and a compressed air tube, wherein the air compressor is coupled to the dust supply apparatus with the compressed air tube, and wherein the dustproof test method further comprises transporting the compressed air into the dust supply apparatus using the air compressor.

14. The dustproof test method of claim 13, wherein the dustproof test device further comprises a flowmeter coupled to the compressed air tube, and wherein the dustproof test method further comprises monitoring a flow of the compressed air that enters the dust supply apparatus using the flowmeter.

15. The dustproof test method of claim 13, wherein the flow control system comprises a main control circuit electrically coupled to the air compressor, and wherein the dustproof test method further comprises controlling the flow of the compressed air using the flow control system.

16. The dustproof test method of claim 15, wherein the flow control system further comprises a dust concentration sampler electrically coupled to the main control circuit, and wherein the dustproof test method further comprises:
   detecting the dust concentration in the sample cabin using the dust concentration sampler; and
   transmitting a dust concentration value to the main control circuit based on detecting the dust concentration.

17. The dustproof test method of claim 16, further comprising:
   comparing the dust concentration value with a preset setting range of the dust concentration to obtain a result using the main control circuit; and
   controlling the flow of the compressed air to maintain the dust concentration within the preset setting range based on the result using the main control circuit, wherein the preset setting range is the dust concentration that is preset in the flow control system.

18. The dustproof test method of claim 17, further comprising increasing the flow of the compressed air using the main control circuit when the result is less than a minimum value of the preset setting range.

19. The dustproof test method of claim 17, further comprising decreasing the flow of the compressed air using the main control circuit when the result is greater than a maximum value of the preset setting range.

* * * * *